(12) United States Patent
Shin

(10) Patent No.: US 9,378,841 B2
(45) Date of Patent: Jun. 28, 2016

(54) SEMICONDUCTOR FUSES AND METHODS OF OPERATING THE SAME

(71) Applicant: SK hynix Inc., Icheon-si, Gyeonggi-do (KR)

(72) Inventor: Tae Kyun Shin, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/526,885

(22) Filed: Oct. 29, 2014

(65) Prior Publication Data

US 2015/0380105 A1 Dec. 31, 2015

(30) Foreign Application Priority Data

Jun. 27, 2014 (KR) .................. 10-2014-0080135

(51) Int. Cl.
*G11C 17/18* (2006.01)
*G11C 17/16* (2006.01)
*G11C 29/44* (2006.01)

(52) U.S. Cl.
CPC .............. *G11C 17/18* (2013.01); *G11C 17/16* (2013.01); *G11C 29/4401* (2013.01)

(58) Field of Classification Search
CPC .............................. G11C 17/18; G11C 17/16
See application file for complete search history.

(56) References Cited

U.S. PATENT DOCUMENTS

| 2006/0197178 A1* | 9/2006 | Chung | G11C 17/16 257/528 |
|---|---|---|---|
| 2013/0033951 A1* | 2/2013 | Gorman | G11C 17/16 365/225.7 |
| 2013/0258748 A1* | 10/2013 | Kim | G11C 17/18 365/96 |
| 2014/0063993 A1* | 3/2014 | Choi | G11C 29/006 365/200 |

FOREIGN PATENT DOCUMENTS

| KR | 1020130123182 A | 11/2013 |
|---|---|---|
| KR | 1020140017075 A | 2/2014 |

* cited by examiner

*Primary Examiner* — J. H. Hur
*Assistant Examiner* — Ajay Ojha
(74) *Attorney, Agent, or Firm* — William Park & Associates Ltd.

(57) ABSTRACT

The semiconductor system includes a controller and a semiconductor device. The controller outputs commands and receives an output datum to discriminate whether at least one of a plurality of fuse cells abnormally operates. The semiconductor device compares logic levels of a plurality of fuse data generated from the plurality of fuse cells with each other, thereby generating a flag signal enabled when at least one of the logic levels of the plurality of fuse data is different from the other logic levels while a boot-up operation is executed according to a combination of the commands. In addition, the semiconductor device outputs the flag signal as the output datum while a read operation is executed according to a combination of the commands.

19 Claims, 5 Drawing Sheets

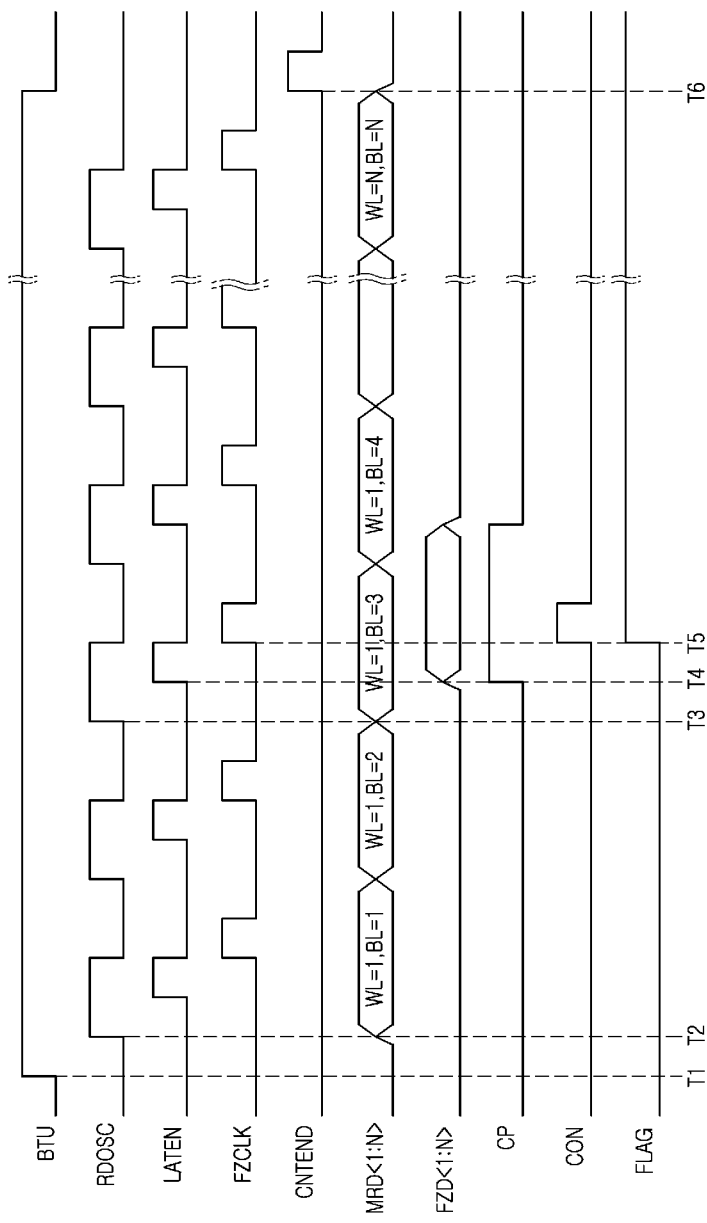

SEMICONDUCTOR FUSES AND METHODS OF OPERATING THE SAME

CROSS-REFERENCE TO RELATED APPLICATION

The present application claims priority under 35 U.S.C 119(a) to Korean Application No. 10-2014-0080135, filed on Jun. 27, 2014, in the Korean Intellectual Property Office, which is incorporated herein by reference in its entirety as set forth in full.

BACKGROUND

1. Technical Field

Embodiments of the disclosure relate to semiconductor devices and semiconductor systems including the same.

2. Related Art

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

According to various embodiments, a semiconductor system includes a controller and a semiconductor device. The controller outputs commands and receives an output datum to discriminate whether at least one of a plurality of fuse cells abnormally operates. The semiconductor device compares logic levels of a plurality of fuse data generated from the plurality of fuse cells with each other, thereby generating a flag signal enabled when at least one of the logic levels of the plurality of fuse data is different from the other logic levels while a boot-up operation is executed according to a combination of the commands. In addition, the semiconductor device outputs the flag signal as the output datum while a read operation is executed according to a combination of the commands.

According to various embodiments, a semiconductor device includes a fuse controller, a fuse array portion, and an output driver. The fuse controller outputs repair data that are counted in response to a boot-up signal. In addition, the fuse controller generates a read oscillation signal including pulses periodically created and a latch enablement signal including pulses periodically created. Moreover, the fuse controller compares a plurality of fuse data with each other to generate a flag signal. The fuse array portion generates the plurality of fuse data whose logic levels are determined according to electrical open/short states of a plurality of fuse cells, one of which is selected by logic level combinations of the repair data. The output driver receives a read signal to output the flag signal as an output datum through an output pad.

BRIEF DESCRIPTION OF THE DRAWINGS

FIG. 5 is a timing diagram illustrating an operation of the semiconductor system shown in FIG. 1.

DETAILED DESCRIPTION

Embodiments of the disclosure will be described hereinafter with reference to the accompanying figures. However, the embodiments described are for illustrative purposes and are not intended to limit the scope of the invention.

Figure 1:
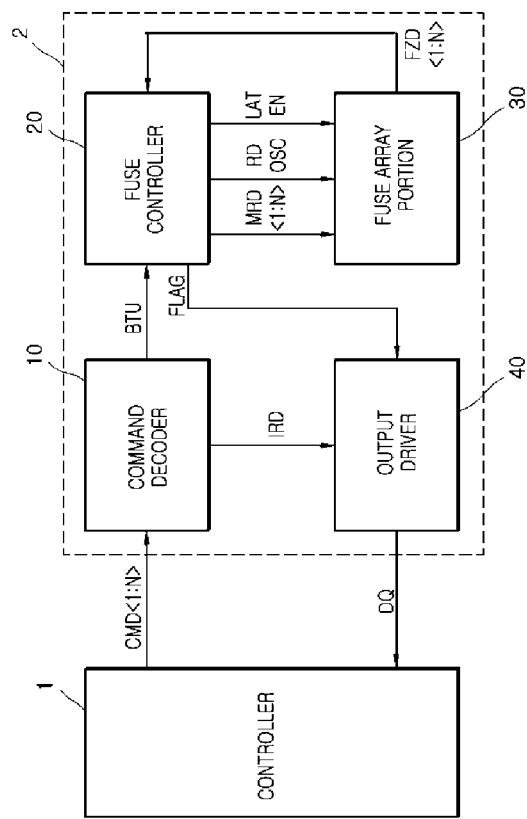
FIG. 1 is a block diagram illustrating a semiconductor system according to an embodiment of the disclosure.

Referring to FIG. 1, a semiconductor system according to an embodiment may include a controller 1 and a semiconductor device 2.

The controller 1 may output commands CMD<1:N> according to an operation mode and receive output data DQ to detect an abnormality of a plurality of fuse cells in the semiconductor device 2. The controller 1 may be configured to control an operation of the semiconductor device 2. For instance, the controller 1 may correspond to an external equipment such as a test equipment to evaluate characteristics of the semiconductor device 2.

The semiconductor device 2 may include a command decoder 10, a fuse controller 20, a fuse array portion 30 and an output driver 40.

The command decoder 10 may decode the commands CMD<1:N> to generate a boot-up signal BTU enabled to execute a boot-up operation or to generate a read signal IRD enabled to execute a read operation. The boot-up operation may be an operation that outputs a plurality of fuse data stored in the plurality of fuse cells programmed to control an internal operation of the semiconductor device 2.

While the boot-up signal BTU is enabled, the fuse controller 20 may output repair data MRD<1:N> that are counted. The fuse controller 20 may also generate a read oscillation signal RDOSC including pulses periodically created. In addition, the fuse controller 20 may also generate a latch enablement signal LATEN including pulses periodically created. In addition, while the boot-up signal BTU is enabled, the fuse controller 20 may compare logic levels of fuse data FZD<1:N> with each other to generate a flag signal FLAG. The flag signal FLAG may be enabled if at least one of the plurality of fuse cells abnormally operates. The repair data MRD<1:N> may include information on positions of the plurality of fuse cells.

The fuse array portion 30 may generate the fuse data FZD<1:N> whose logic levels are determined according to electrical open/short states of the plurality of fuse cells selected by logic level combinations of the repair data MRD<1:N>.

The output driver 40 may receive the flag signal FLAG to output the flag signal FLAG as the output data DQ through an output pad while the read signal IRD is enabled.

As described above, the semiconductor device 2 may compare logic levels of the fuse data FZD<1:N> outputted from the plurality of fuse cells with each other to generate the flag signal FLAG enabled when at least one of the logic levels of the fuse data FZD<1:N> is different from the others while the boot-up operation is executed according to a combination of the commands CMD<1:N>.

The semiconductor device 2 may also output the flag signal FLAG as the output data DQ while the read operation is executed according to a combination of the commands CMD<1:N>.

Figure 2:
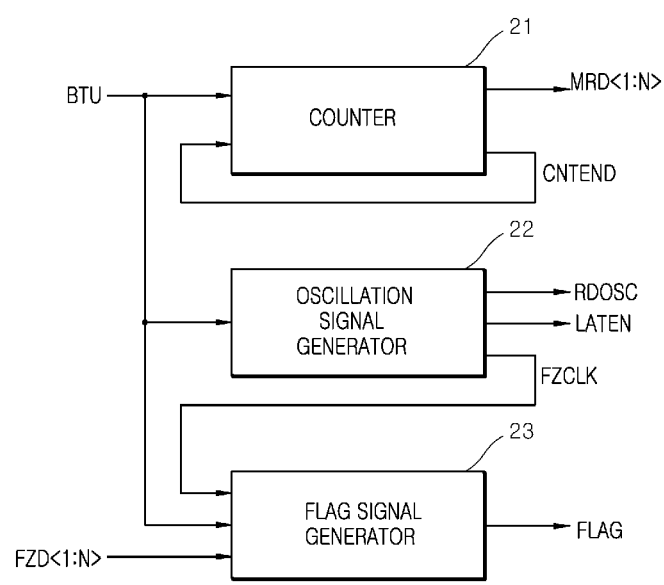
FIG. 2 is a block diagram illustrating a fuse controller included in the semiconductor system of FIG. 1.

Referring to FIG. 2, the fuse controller 20 may include a counter 21, an oscillation signal generator 22 and a flag signal generator 23.

The counter 21 may output the repair data MRD<1:N> counted in response to the boot-up signal BTU which is enabled. The counter 21 may also generate count end signal CNTEND which is enabled if all bits of the repair data MRD<1:N> are counted. Further, the counter 21 may initialize the repair data MRD<1:N> if the count end signal CNTEND is enabled.

If the boot-up signal BTU is enabled, the oscillation signal generator 22 may generate the read oscillation signal RDOSC including pulses periodically created. The oscillation signal generator 22 may also generate the latch enablement signal LATEN including pulses periodically created. Further, the oscillation signal generator 22 may generate a fuse clock signal FZCLK including pulses periodically created.

If the boot-up signal BTU is enabled, the flag signal generator 23 may compare logic levels of the fuse data FZD<1:N> with each other in response to the fuse clock signal FZCLK to generate the flag signal FLAG enabled when at least one of the logic levels of the fuse data FZD<1:N> is different from the others.

Figure 3:
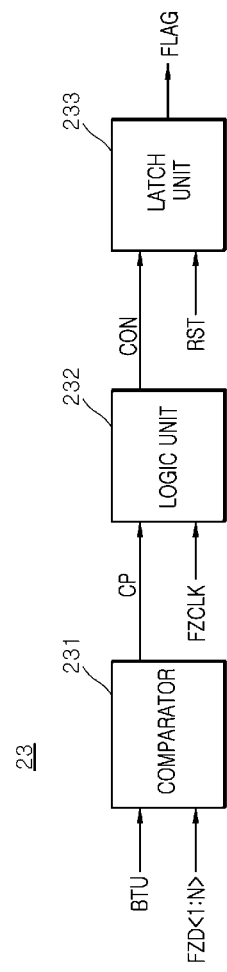
FIG. 3 is a block diagram illustrating a flag signal generator included in the fuse controller of FIG. 2.

Referring to FIG. 3, the flag signal generator 23 may include a comparator 231, a logic unit 232 and a latch unit 233.

The comparator 231 may generate a comparison signal CP enabled to have a logic "high" level if at least one of the logic levels of the fuse data FZD<1:N> is different from the others while the boot-up signal BTU is enabled.

The logic unit 232 may output the comparison signal CP as a control signal CON during pulse widths of the fuse clock signal FZCLK.

The latch unit 233 may generate the flag signal FLAG initialized to a logic "low" level if a reset signal RST is enabled and enabled to a logic "high" level if the control signal CON is enabled. The reset signal RST may be enabled during a predetermined period after a power-up period that a power supply voltage VDD supplied from an external device increases from a ground voltage to a target voltage with a constant slope or during a predetermined period while the boot-up operation is executed.

Figure 4:
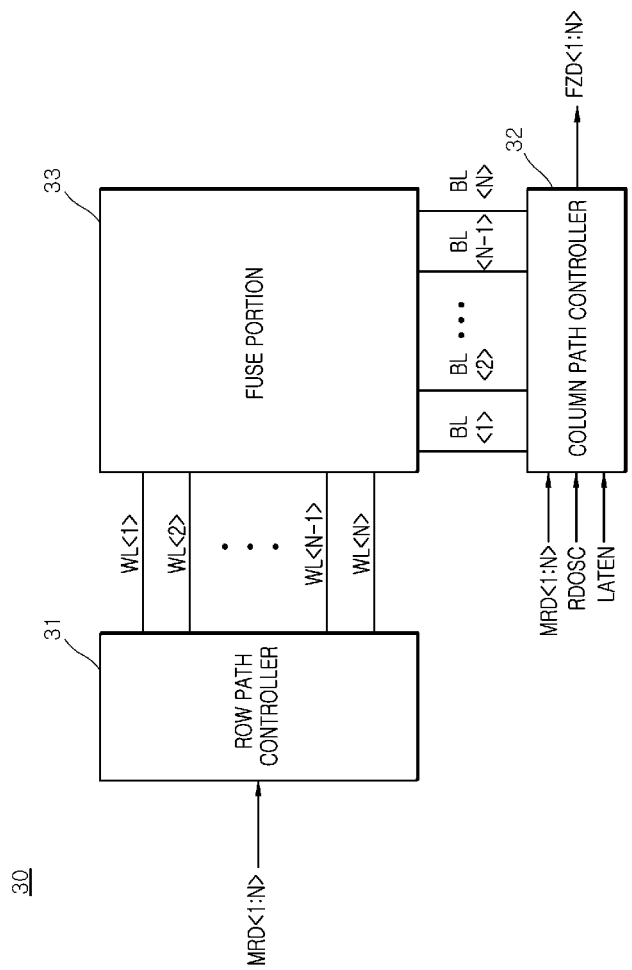
FIG. 4 is a block diagram illustrating a fuse array portion included in the semiconductor system of FIG. 1.

Referring to FIG. 4, the fuse array portion 30 may include a row path controller 31, a column path controller 32 and a fuse portion 33.

The row path controller 31 may receive the repair data MRD<1:N> to select any one among a plurality of word lines WL<1:N> according to a logic level combination of the repair data MRD<1:N>.

The column path controller 32 may receive the repair data MRD<1:N> to select any one among a plurality of bit lines BL<1:N> according to a logic level combination of the repair data MRD<1:N>. In addition, the column path controller 32 may sense and amplify a datum on the selected bit line BL to output the amplified datum as one of the fuse data FZD<1:N> if the read oscillation signal RDOSC and the latch enablement signal LATEN are enabled. Accordingly, if the plurality of bit lines BL<1:N> are sequentially selected, the column path controller 32 may serially output the fuse data FZD<1:N>.

The fuse portion 33 may include a plurality of fuse cells disposed at intersections of the plurality of word lines WL<1:N> and the plurality of bit lines BL<1:N>. Each of the plurality of fuse cells may be realized using a transistor type e-fuse. In various embodiments, the e-fuses employed as the fuse cells may be initially non-programmed.

An operation of the semiconductor system having the aforementioned configuration will be described with reference to FIGS. 1 to 5 in conjunction with an example in which a fuse cell electrically coupled to the first word line WL<1> and the third bit line BL<3> abnormally operates. First, at time "T1," the controller 1 may output the commands CMD<1:N> to execute the boot-up operation.

The command decoder 10 of the semiconductor device 2 may decode the commands CMD<1:N> to generate the boot-up signal BTU having a logic "high" level.

Next, at time "T2," the counter 21 of the fuse controller 20 may count the repair data MRD<1:N> in response to the boot-up signal BTU having a logic "high" level and may generate the counted repair data MRD<1:N> to select the first word line WL<1> and the first bit line BL<1>. The oscillation signal generator 22 may receive the boot-up signal BTU having a logic "high" level to generate the read oscillation signal RDOSC having a logic "high" level.

The row path controller 31 of the fuse array portion 30 may select the first word line WL<1> in response to the repair data MRD<1:N>. In addition, the column path controller 32 of the fuse array portion 30 may select the first bit line BL<1> in response to the repair data MRD<1:N>. Further, the column path controller 32 may receive the read oscillation signal RDOSC having a logic "high" level to generate the fuse data FZD<1:N>, all bits of which have logic "low" levels.

The flag signal generator 23 may compare the fuse data FZD<1:N> with each other in response to the boot-up signal BTU having a logic "high" level to generate the flag signal FLAG having a logic "low" level.

An operation of selecting the first word line WL<1> and the second bit line BL<2> and an operation of generating the flag signal FLAG by comparing the fuse data FZD<1:N> obtained from the fuse cell electrically coupled to the first word line WL<1> and the second bit line BL<2> may be the same as described above. Accordingly, descriptions of the operations to select the first word line WL<1> and the second bit line BL<2> and generating the flag signal FLAG by comparing the fuse data FZD<1:N> obtained from the fuse cell electrically coupled to the first word line WL<1> and the second bit line BL<2> will be omitted.

Subsequently, at time "T3," the counter 21 of the fuse controller 20 may count the repair data MRD<1:N> in response to the boot-up signal BTU having a logic "high" level. The counter 21 may also generate the counted repair data MRD<1:N> to select the first word line WL<1> and the third bit line BL<3>. The oscillation signal generator 22 may receive the boot-up signal BTU having a logic "high" level to generate the read oscillation signal RDOSC having a logic "high" level.

The row path controller 31 of the fuse array portion 30 may select the first word line WL<1> in response to the repair data MRD<1:N>. In addition, the column path controller 32 of the fuse array portion 30 may select the third bit line BL<3> in response to the repair data MRD<1:N>.

The flag signal generator 23 may compare the fuse data FZD<1:N> with each other in response to the boot-up signal BTU having a logic "high" level to generate the flag signal FLAG having a logic "low" level.

Subsequently, at time "T4," the oscillation signal generator 22 of the fuse controller 20 may generate the latch enablement signal LATEN having a logic "high" level.

The column path controller 32 may receive the read oscillation signal RDOSC having a logic "high" level and the latch enablement signal LATEN having a logic "high" level to generate the third fuse data FZD<3> having a logic "high" level.

The comparator 231 may compare logic levels of the fuse data FZD<1:N> with each other in response to the boot-up signal BTU having a logic "high" level to generate the comparison signal CP having a logic "high" level.

Subsequently, at time "T5," the oscillation signal generator 22 may receive the boot-up signal BTU having a logic "high" level to generate the fuse clock signal FZCLK having a logic "high" level.

The logic unit 232 of the flag signal generator 23 may receive the fuse clock signal FZCLK having a logic "high" level to output the comparison signal CP having a logic "high" level as the control signal CON. The latch unit 233 may receive the control signal CON having a logic "high" level to generate the flag signal FLAG having a logic "high" level.

Operations of counting the repair data MRD<1:N> to select the remaining word lines and the remaining bit line and operations of generating the flag signal FLAG by comparing the fuse data FZD<1:N> obtained from the fuse cells electrically coupled to the remaining word lines and the remaining bit lines may be the same as those described above. Thus, descriptions of the operations to count the repair data MRD<1:N> to select the remaining word lines and the remaining bit lines and generating the flag signal FLAG by comparing the fuse data FZD<1:N> obtained from the fuse cells electrically coupled to the remaining word lines and the remaining bit lines will be omitted.

Next, at time "T6," all bits of the repair data MRD<1:N> are counted and generation of the repair data MRD<1:N> to select the N$^{th}$ word line WL<N> and the N$^{th}$ bit line BL<N> terminates. Thus, the counter 21 of the fuse controller 20 may generate the count end signal CNTEND having a logic "high" level and may initialize the repair data MRD<1:N> in response to the count end signal CNTEND having a logic "high" level. More specifically, all bits of the repair data MRD<1:N> may be initialized to have logic "low" levels.

The semiconductor device 2 may output the flag signal FLAG having a logic "high" level as the output data DQ through an output pad during a read operation. If the output data DQ having a logic "high" level is inputted to the controller 1, the controller 1 may recognize that the semiconductor device 2 has a defect such as a failed fuse cell in the fuse array portion 30.

As described above, during a boot-up operation, a semiconductor device according to an embodiment may output a plurality of fuse data obtained from all of fuse cells which are non-programmed. In addition, the semiconductor device may compare logic levels of the plurality of fuse data with each other to generate a flag signal. The flag signal may be outputted from the semiconductor device during a read operation. Further, a controller may receive the flag signal to discriminate whether the semiconductor device has an abnormal fuse cell.

What is claimed is:

1. A semiconductor system comprising:
   a controller suitable for outputting commands and receiving an output datum to discriminate whether at least one of a plurality of fuse cells abnormally operates; and
   a semiconductor device suitable for comparing logic levels of a plurality of fuse data generated from the plurality of fuse cells with each other to generate a flag signal enabled when at least one of the logic levels of the plurality of fuse data is different from the other logic levels while a boot-up operation is executed according to a combination of the commands and for outputting the flag signal as the output datum while a read operation is executed according to a combination of the commands.

2. The semiconductor system of claim 1, wherein the flag signal is enabled when the plurality of fuse cells include at least one abnormal fuse cell.

3. The semiconductor system of claim 1, wherein the boot-up operation is executed to sequentially output the plurality of fuse data generated according to electrical open/short states of the plurality of fuse cells.

4. The semiconductor system of claim 1, wherein the semiconductor device includes:
   a fuse controller suitable for outputting repair data counted in response to a boot-up signal, for generating a read oscillation signal including pulses periodically created and a latch enablement signal including pulses periodically created, and comparing the plurality of fuse data with each other to generate the flag signal;
   a fuse array portion suitable for generating the plurality of fuse data whose logic levels are determined according to electrical open/short states of the plurality of fuse cells selected by logic level combinations of the repair data; and
   an output driver suitable for receiving a read signal to output the flag signal as the output datum through an output pad.

5. The semiconductor system of claim 4, wherein the repair data includes information on positions of the plurality of fuse cells.

6. The semiconductor system of claim 4, wherein the fuse controller includes:
   a counter suitable for outputting the repair data counted in response to the boot-up signal and for initializing the repair data in response to a count end signal;
   an oscillation signal generator suitable for receiving the boot-up signal to generate the read oscillation signal including pulses periodically created, the latch enablement signal including pulses periodically created, and a fuse clock signal including pulses periodically created; and
   a flag signal generator suitable for comparing the fuse data with each other in response to the boot-up signal and the fuse clock signal to generate the flag signal.

7. The semiconductor system of claim 6, wherein the count end signal is enabled if all bits of the repair data are counted.

8. The semiconductor system of claim 6, wherein the flag signal generator includes:
   a comparator suitable for receiving the boot-up signal to generate a comparison signal enabled if at least one among logic levels of the fuse data is different from the other logic levels;
   a logic unit suitable for outputting the comparison signal as a control signal during pulse widths of the fuse clock signal; and
   a latch unit suitable for generating the flag signal initialized in response to a reset signal and whose logic level is changed in response to the control signal.

9. The semiconductor system of claim 8, wherein the reset signal is enabled during a predetermined period after a power-up period that a power supply voltage supplied from an external device rises up to a target voltage or during a predetermined period while the boot-up operation is executed.

10. The semiconductor system of claim 4, wherein the fuse array portion includes:
    a row path controller suitable for selecting any one among a plurality of word lines according to a logic level combination of the repair data;
    a column path controller suitable for selecting any one among a plurality of bit lines according to a logic level combination of the repair data and for sensing and amplifying a datum on the selected bit line to output the sensed and amplified datum as one of the fuse data in response to the read oscillation signal and the latch enablement signal; and a fuse portion including the plurality of fuse cells disposed at intersections of the plurality of word lines and the plurality of bit lines.

11. The semiconductor system of claim 4, further comprising:

a command decoder suitable for decoding the commands to generate the boot-up signal during the boot-up operation and for decoding the commands to generate the read signal during the read operation.

12. A semiconductor device comprising:

a counter suitable for outputting repair data counted in response to a boot-up signal and for initializing the repair data in response to a count end signal;

an oscillation signal generator suitable for receiving the boot-up signal to generate a read oscillation signal including pulses periodically created, a latch enablement signal including pulses periodically created, and a fuse clock signal including pulses periodically created;

a flag signal generator suitable for comparing a plurality of fuse data with each other in response to the boot-up signal and the fuse clock signal to generate a flag signal;

a fuse array portion suitable for generating the plurality of fuse data whose logic levels are determined according to electrical open/short states of a plurality of fuse cells, one of which is selected by logic level combinations of the repair data; and an output driver suitable for receiving a read signal to output the flag signal as an output datum through an output pad.

13. The semiconductor device of claim 12, wherein the flag signal is enabled when the plurality of fuse cells include at least one abnormal fuse cell.

14. The semiconductor device of claim 12, wherein the boot-up signal is enabled to execute a boot-up operation that sequentially outputs the plurality of fuse data generated according to electrical open/short states of the plurality of fuse cells.

15. The semiconductor device of claim 12, wherein the repair data include information on positions of the plurality of fuse cells.

16. The semiconductor device of claim 12, wherein the count end signal is enabled if all bits of the repair data are counted.

17. The semiconductor device of claim 12, wherein the flag signal generator includes:

a comparator suitable for receiving the boot-up signal to generate a comparison signal enabled if at least one among logic levels of the fuse data is different from the other logic levels;

a logic unit suitable for outputting the comparison signal as a control signal during pulse widths of the fuse clock signal; and a latch unit suitable for generating the flag signal initialized in response to a reset signal and whose logic level is changed according to the control signal.

18. The semiconductor device of claim 17, wherein the reset signal is enabled during a predetermined period after a power-up period that a power supply voltage supplied from an external device rises up to a target voltage or during a predetermined period while the boot-up operation is executed.

19. The semiconductor device of claim 12, wherein the fuse array portion includes:

a row path controller suitable for selecting any one among a plurality of word lines according to a logic level combination of the repair data;

a column path controller suitable for selecting any one among a plurality of bit lines according to a logic level combination of the repair data and for sensing and amplifying a datum on the selected bit line to output the sensed and amplified datum as one of the fuse data in response to the read oscillation signal and the latch enablement signal; and a fuse portion including the plurality of fuse cells disposed at intersections of the plurality of word lines and the plurality of bit lines.

* * * * *